United States Patent
Chen et al.

(10) Patent No.: US 11,280,832 B1
(45) Date of Patent: Mar. 22, 2022

(54) MEMORY EMBEDDED FULL SCAN FOR LATENT DEFECTS

(71) Applicant: Arm Limited, Cambridge (GB)

(72) Inventors: Andy Wangkun Chen, Austin, TX (US); Frank David Frederick, Austin, TX (US); Richard Slobodnik, Austin, TX (US)

(73) Assignee: Arm Limited, Cambridge (GB)

( * ) Notice: Subject to any disclaimer, the term of this patent is extended or adjusted under 35 U.S.C. 154(b) by 39 days.

(21) Appl. No.: 17/013,628

(22) Filed: Sep. 6, 2020

(51) Int. Cl.
*G01R 31/3177* (2006.01)
*G11C 11/419* (2006.01)
*G01R 31/317* (2006.01)
*G11C 11/409* (2006.01)
*H03K 19/20* (2006.01)

(52) U.S. Cl.
CPC ... *G01R 31/3177* (2013.01); *G01R 31/31724* (2013.01); *G01R 31/31727* (2013.01); *G11C 11/409* (2013.01); *G11C 11/419* (2013.01); *H03K 19/20* (2013.01)

(58) Field of Classification Search
CPC .......... G01R 31/3177; G01R 31/31724; G01R 31/31727; G11C 11/419; G11C 11/409; H03K 19/20
USPC .......... 714/727, 726, 729, 718, 30; 365/200, 365/201
See application file for complete search history.

(56) References Cited

U.S. PATENT DOCUMENTS

| | | | | |
|---|---|---|---|---|
| 6,680,871 B1* | 1/2004 | Price | ..................... | G11C 29/32 326/38 |
| 6,880,137 B1* | 4/2005 | Burlison | ........ | G01R 31/318547 702/119 |
| 7,746,102 B1* | 6/2010 | Young | .............. | H03K 19/17736 326/38 |
| 7,761,754 B1* | 7/2010 | Ang | ........................ | G11C 29/12 714/718 |
| 8,331,163 B2* | 12/2012 | Koeppe | .................. | G11C 29/10 365/189.05 |
| 10,222,418 B2 | 3/2019 | Chong et al. | | |
| 2010/0332928 A1* | 12/2010 | Li | .................. | G01R 31/318552 714/731 |

(Continued)

OTHER PUBLICATIONS

Ockunzzi et al., Optimizing Delay Tests at the Memory Boundary, 2015, IEEE, pp. 1-9. (Year: 2015).*

(Continued)

*Primary Examiner* — John J Tabone, Jr.
(74) *Attorney, Agent, or Firm* — Quinn IP Law (57) ABSTRACT

A memory circuit includes input multiplexers passing one of a pair of input bits. A first input multiplexer receives a first data bit and a serial input bit. Additional input multiplexers receive either a respective pair of data (D) bits, or a write-enable (WEN) bit and a single D bit. Scan latches receive one of the input bits and provide a scan output bit. OR gates arranged receive the scan output bit from a different scan latch, and perform a logical OR operation thereon to generate an OR output bit. Downstream output multiplexers pass a corresponding bit from a bit array or the OR output bit from a corresponding OR gate, and sense latches receive the corresponding bit from one of the output multiplexers and provide a sense output bit. Each sense output bit feeds into one or more input multiplexers when a bit-write-mask function is disabled.

18 Claims, 8 Drawing Sheets

(56) References Cited

U.S. PATENT DOCUMENTS

| | | | | |
|---|---|---|---|---|
| 2013/0080847 | A1* | 3/2013 | Zorian | G06F 30/39 |
| | | | | 714/718 |
| 2013/0311843 | A1* | 11/2013 | Tekumalla | G01R 31/318555 |
| | | | | 714/729 |
| 2018/0052199 | A1* | 2/2018 | Douskey | G01R 31/3177 |
| 2018/0218778 | A1* | 8/2018 | Chakraborty | G11C 29/022 |
| 2018/0238965 | A1* | 8/2018 | Anzou | G11C 29/32 |

OTHER PUBLICATIONS

Analog Devices, Inc., Improviing Testability of Integrated Circuits with Embedded Memory, May 17, 2011, IP.com, IP.com No. IPCOM000207106D, pp. 1-9. (Year: 2011).*

Yano et al., Memory Array Testing through a Scannable Configuration, 1997, IEEE, pp. 87-94. (Year: 1997).*

Yano, Unified Scan Design with Scannable Memory Arrays, 1995, IEEE, pp. 153-159. (Year: 1995).*

\* cited by examiner

Fig-1

| CLK | CEN | GWEN | D | WEN | SI | DFTRAMBYP | SE | Q | Description |
|---|---|---|---|---|---|---|---|---|---|
| R | 0 | 0 | X | X | X | 0 | X | Q | WRITE (Mission Mode) |
| R | 0 | 1 | X | X | X | 0 | X | MEM | READ (Mission Mode) |
| R | X | X | D | 0 | X | 1 | 0 | D | Scan Capture |
| R | X | X | D | 1 | X | 1 | 0 | 1 | Scan Capture |
| R | X | X | X | X | SI | 1 | 1 | * | Scan Shift |

| CLK | CEN | GWEN | D | WEN | SI | DFTRAMBYP | SE | Q | Description |
|---|---|---|---|---|---|---|---|---|---|
| R | 0 | 0 | X | tielow | X | 0 | X | Q | WRITE (Mission Mode) |
| R | 0 | 1 | X | tielow | X | 0 | X | MEM | READ (Mission Mode) |
| R | X | X | D | tielow | X | 1 | 0 | D | Scan Capture |
| R | X | X | X | tielow | SI | 1 | 1 | * | Scan Shift |

| CLK | CEN | GWEN | D | WEN | SI | DFTRAMBYP | SE | Q | Description |
|---|---|---|---|---|---|---|---|---|---|
| R | 0 | 0 | X | tielow | X | 0 | X | Q | WRITE (Mission Mode) |
| R | 0 | 1 | X | tielow | X | 0 | X | Q | READ (Mission Mode) |
| R | X | X | D | tielow | X | 1 | 0 | MEM D[y] / Q[y-1] | Scan Capture |
| R | X | X | X | tielow | SI | 1 | 1 | * | Scan Shift |

| CLK | CEN | GWEN | D | WEN | SI | DFTRAMBYP | SE | Q | Description |
|---|---|---|---|---|---|---|---|---|---|
| R | 0 | 0 | X | tielow | X | 0 | X | Q | WRITE (Mission Mode) |
| R | 0 | 1 | X | tielow | X | 0 | X | Q | READ (Mission Mode) |
| R | X | X | D | tielow | X | 1 | 0 | MEM D[y] D[y-1] | Scan Capture |
| R | X | X | X | tielow | SI | 1 | 1 | * | Scan Shift |

MEMORY EMBEDDED FULL SCAN FOR LATENT DEFECTS

INTRODUCTION

Disclosed herein are memory integrated circuits (ICs) and associated embedded full-scan methodologies. Embedded memory scanning applications, which sometimes include automatic test pattern generation, are often used to simplify combinatorial logic testing of memory instances and other integrated circuits. A memory compiler of the type commonly used for memory design and validation typically employs an architecture specifying required circuit elements and test signals. Compiler inputs may include one or more bitcell arrays, multiplexing arrangements, built-in self-test (BIST) modes, and possibly other user-selectable modes or logic features. A given memory instance created with the assistance of a memory compiler may be used in a myriad of applications. Since a given memory application may or may not require all of the available logic features of a given memory instance, users are typically permitted to de-select or disable unused logic features.

Scan cell chains are implemented in embedded memory scanning applications to fully test and validate the performance of constituent logic against an expected or modeled performance. In a typical embedded D/Q scan cell chain for a memory register, for instance, scanning inputs may be individually fed into corresponding flip-flops or latches. A separate scan chain may be used for testing write-enable (WEN) functions, with the D/Q and WEN scan chains possibly being combined in other configurations. When a bit-write mask is disabled, the available WEN inputs are tied-off to a low/O logic state. This action ties off associated logical signal propagation paths or "logic cones" of the WEN scan chain while leaving intact the associated logic cones of the associated memory circuit.

SUMMARY

Memory circuits and associated methods are disclosed herein. According to an exemplary embodiment, the memory circuit includes input and output phase circuits. The input phase circuit includes first set of multiplexers ("input MUXes") each configured to receive a pair of input bits, and in response to a scan enable signal (SE), to selectively pass one of the pair of input bits. The input MUXes include a first MUX arranged to receive, as the pair of input bits, a first data bit D[0] and a serial input bit SI[0]. Additional input MUXes are arranged to receive, as the pair of input bits, either a respective pair of data (D) bits, or a write-enable (WEN) bit and a single D bit.

The input phase includes scan latches each arranged to receive one of the pair of input bits from a respective input MUX, and to provide an upstream/scan output bit ($Q_U$) in response to an edge of a digital clock signal. As used herein, the subscript "U" indicates "upstream" relative to a signal flow direction through the memory circuit.

The output phase includes a plurality of logical OR gates each arranged to receive the scan output bit ($Q_U$) from a different corresponding pair of the scan latches, and to perform a logical OR operation thereon to thereby generate an OR output bit. The output phase also includes a second set of multiplexers ("output MUXes") each arranged to pass either a corresponding bit from a bit array or the OR output bit from a corresponding one of the OR gates, and a plurality of sense latches. Each downstream sense latch is arranged to receive the corresponding scan output bit from one of the input MUXes and provide a downstream output bit ($Q_D$), with the subscript "D" referring herein to "downstream" relative to the signal flow direction through the memory circuit.

In this particular embodiment, each downstream output bit that is output by the sense latches is fed into two or more of the input MUXes as either one of the pair of D bits or as the single D bit, thus allowing the WEN bit to toggle when solving the particular control issues addressed herein.

An input phase circuit is also disclosed herein for use in a memory circuit, the latter having (n/2) sense latches logically coupled to (n) scan latches of the input phase circuit by a respective OR gate and output MUX. That is, each output MUX receives an OR output bit from the respective OR gate and a bit value from a bit array.

The input phase circuit according to an exemplary embodiment includes a set of (n) input MUXes, with (n) being an even integer value. Each input MUX is configured to receive a pair of input bits and, in response to a scan enable signal (SE), to selectively pass one of the pair of input bits to a respective one of the scan latches. The input MUXes include a first MUX arranged to receive a first data bit D[0] and a serial input bit SI[0] from a control circuit, and (n−1) additional MUXes each arranged to receive either a respective pair of data (D) bits, or a write-enable (WEN) bit and a single D bit.

In this embodiment, an output bit from a plurality of the sense latches is fed into two or more of the input MUXes as either one of the pair of D bits or as the single D bit. During a scan capture operation in which a bit-write-mask function is disabled, such an arrangement enables the WEN bit, which is tied-low when the bit-write-mask function is disabled, to be selectively toggled between high and low logic values.

A method for performing an embedded scan chain operation is also disclosed. According to a representative embodiment of the method, the method includes generating a plurality of multiplexed bits by multiplexing a pair of input bits through each multiplexer of a first set of multiplexers ("input MUXes") in response to a scan enable (SE) signal. The input MUXes include a first input MUX arranged to receive a first data bit D[0] and a serial input bit SI[0], and a plurality of second input MUXes each arranged to receive either a respective pair of data bits or a write-enable (WEN) bit and a single data bit (D[0]-D[n/2−1]).

The method may include generating a plurality of latched bits, including latching the multiplexed bits in response to an edge of a clock signal (CLK), and processing different corresponding pairs of the latched bits through an OR gate to thereby generate a plurality of logic bits. The method may also include latching the logic bits to thereby generate a plurality of additional latched bits, and feeding each additional latched bit into two or more of the input MUXes as one of the pair of data bits or the single data bit to thereby enable the WEN bit to control the additional latched bit during a scan operation in which a bit-write-mask operation is disabled. The WEN bit, which is tied-low when the bit-write-mask function is disabled, is thus selectively toggled between high and low logic values.

The above features and advantages and other features and advantages of the present disclosure are readily apparent from the following detailed description of the best modes for carrying out the invention when taken in connection with the accompanying drawings.

BRIEF DESCRIPTION OF THE DRAWINGS

Implementations of the various techniques are described herein with reference to the accompanying drawings. It should be understood, however, that the accompanying drawings illustrate only various implementations described herein and are not meant to limit embodiments of various techniques described herein.

DETAILED DESCRIPTION

Disclosed herein are memory circuits having tied-off logic cones and associated full-scan methodologies for detecting latent defects in such a memory circuit. Tied-off logic provides numerous benefits in the design and testing of volatile and non-volatile memory instances, including reducing pin count and customizing a given memory instance for a particular end use. However, it is recognized herein that tied-off logic cones corresponding to user-deselected or disabled logic paths lack observability and full testability. As a result, latent faults may exist in the tied-off logic cones that cannot be properly screened during a memory scan. The proposed solutions are intended to provide added controllability and observability of latent faults in tied-off logic cones in order to improve transition coverage, particularly when a bit-write mask function is disabled, which in turn results in write-enable (WEN) inputs being tied-off/low, i.e., set to a binary logical value of "0".

As will be appreciated by those of ordinary skill in the art, embedded scan chains inclusive of input/output multiplexers, latches and/or flip-flops, associated serial pins, and control circuitry providing the requisite input control signals are currently used in state-of-the-art memory macro designs. The control circuitry checks all memory addresses with a read-write operation in order to determine proper functionality. In general, a given memory/bitcell register is loaded with predetermined data during a scan capture stage. The loaded data is selectively shifted through the register during a subsequent scan shift stage by operation of the constituent latches and combinatorial logic.

As noted above, tied-off logic cones preclude observability and testability of unused circuits in the memory macro. While the existence of untestable logic cones does not necessarily affect overall test coverage and may still permit detection of certain gross defects, reduced fault coverage due to tied-off logic cones may adversely affect certain safety-critical, high-reliability, or other applications requiring the full controllability and observability of all aspects of the memory circuit. The present disclosure is therefore intended to improve upon the capability of existing memory circuits having such tied-off logic, and to provide a mechanism for screening for latent faults of the type not otherwise observable due to such tie-offs.

An example latent defect is that of a resistive fault in the transistor or other hardware implementing a latch or other component of the memory circuit, which may manifest over time as a slow state transition. Resistive faults are typically detected by a transition delay test requiring full control and observability of the particular logic cone having the defect. When a bit-write mask is enabled/turned ON in a memory compiler, a write enable (WEN) signal becomes an available input signal and thus enables full test control at a given node. However, the WEN signal is no longer available as an input signal when the bit-write mask is disabled/turned OFF. The WEN function becomes tied-off or set to a low/0 state, a condition referred to hereinafter as "tied-low". Tied-off logic cones are of particular concern when testing for resistive faults and other transition faults as opposed to stuck-at-value faults, with such faults potentially impacting the intended functionality of the memory circuit. The present solutions are therefore intended as a memory embedded full scan implementation for improving control and detecting latent defects in an integrated circuit possible having latent defects in a tied-off logic cone.

Accordingly, various embodiments for implementing a memory scan process will now be described with reference to FIGS. 1-8 for (n) rows of data bits, i.e., [0], [1], . . . , [n/2−1], with (n) being an even integer value, e.g., 4, 6, 8, etc., and each row having corresponding input signals during a scan function. Beginning with FIG. 1 and the corresponding truth table of FIG. 2, FIGS. 1 and 2 together describe an exemplary memory circuit 10 in accordance with an embodiment in which a bit-write-mask function is enabled ("bit-write-mask=ON"). Such a mode allows a particular bit in a bit address to be set to 0 or 1 as needed, with the WEN bit controlling downstream outputs ($Q_D$) during scan capture, e.g., $Q_D$=D when WEN=0 and $Q_D$=1 when WEN=1. Likewise, D and WEN values will not affect $Q_D$ during a write mode, with such a mode depicted in FIGS. 2, 4, 6, and 8 as "WRITE (mission mode)".

Figure 1:
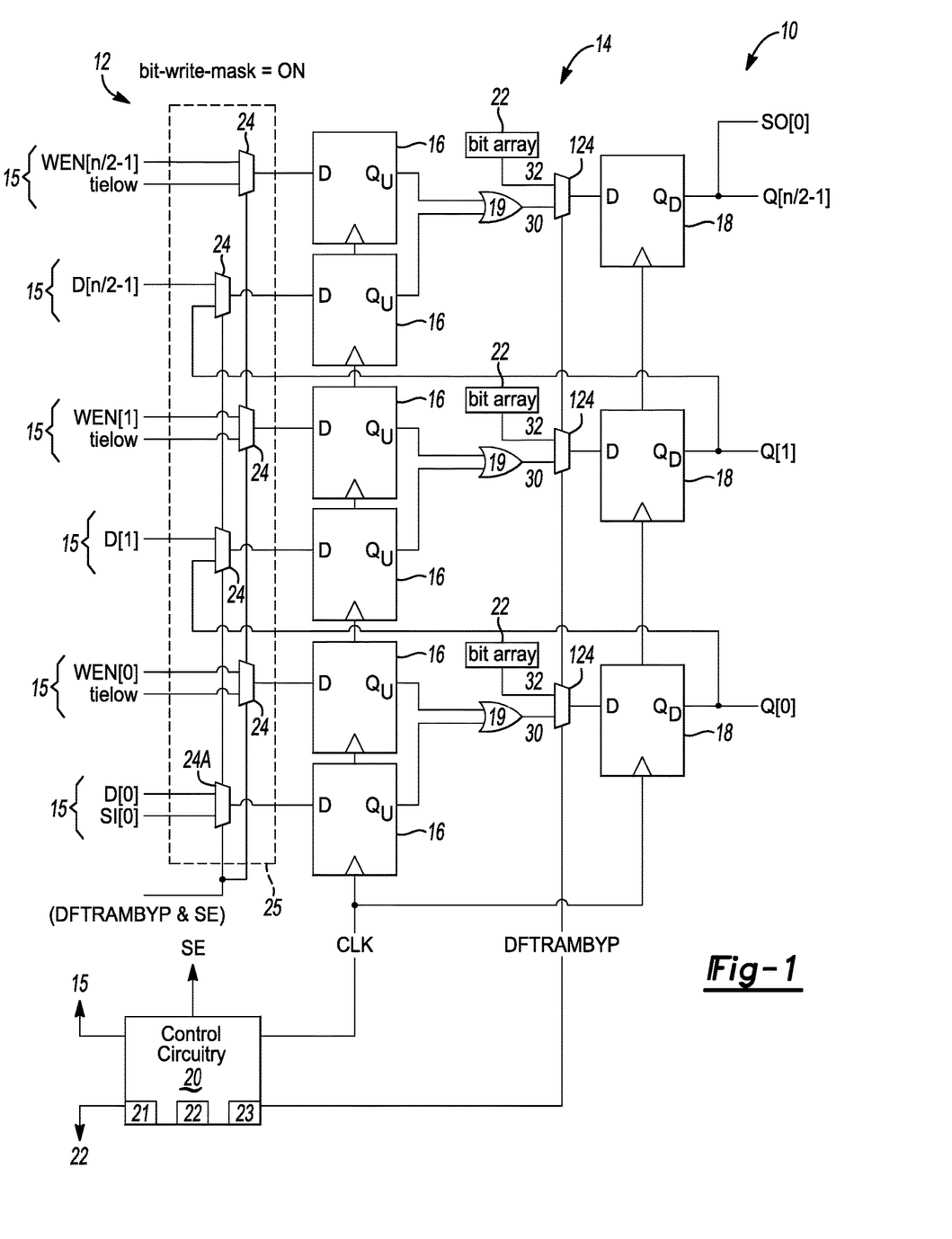
FIGS. 1 and 2 respectively depict a circuit diagram and associated truth table for an exemplary integrated memory circuit in accordance with embedded scan chain implementations as described herein, with the arrangement describing a scan mode in which a bit-write-mask function is enabled.
Figure 2:
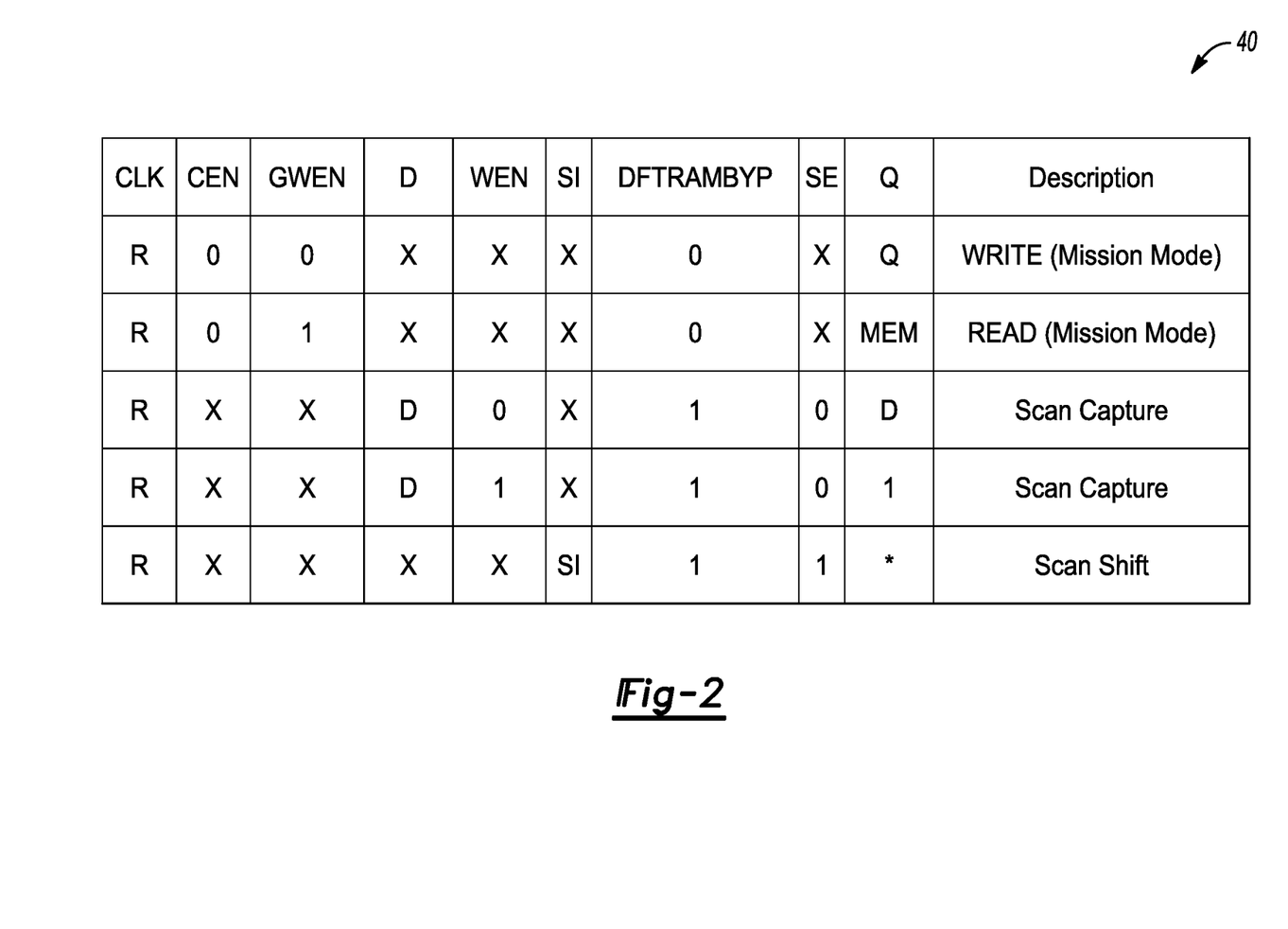

In FIG. 1, the memory circuit 10 uses a single scan chain for performing both data (D) and write-enable (WEN) functions. As will be appreciated, a write mask is generally used to mask and thus prevent writing to a given bit location in a memory register. When the bit-write-mask function is enabled/turned ON, full controllability is afforded over the WEN bits, and thus the WEN bits are available as inputs. Thus, the masked state of FIGS. 1-2 is fundamentally different than that of FIGS. 3-8 as described below, with FIGS. 3-8 depicting the memory circuit 10 as it appears in a mode in which the bit-write-mask function is disabled/turned OFF. In such a mode, absent the present teachings, defects in tied-off WEN logic paths are not detectable.

The memory circuit 10 of FIG. 1 includes an input phase circuit 12 and an output phase circuit 14. Portions of the input phase circuit 12 and/or the output phase circuit 14 may be nominally organized as an intermediate phase circuit (not shown) in other embodiments. The input phase circuit 12 is configured to improve transition coverage during a memory full scan process in a combined DQ and WEN scan chain as shown. Unlike prior art approaches in which the input phase of a combined DQ and WEN scan chain feeds WEN inputs through logical AND gates, and thus ultimately results in tied-low WEN inputs blocking observability of latent defects the in tied-off logic cones, the input phase circuit 12 described herein is characterized by an absence of such AND logic gates. That is, there are separate input latches for write data and write mask inputs. As will be appreciated, the present construction re-uses circuits otherwise used in functional modes, thus enabling the highest quality of test versus existing approaches. For simplicity, all inputs are shown as being provided by associated control circuitry 20 having a processor 21, including a serial input bit (SI[0]), a scan enable signal (SE), a test mode control signal DFTRAMBYP as described below, data bits (D[0], D[1], . . . , D[n/2−1]), WEN bits (WEN[0], WEN[1], . . . , WEN[n/2−1]), and a bit array 22.

With respect to the input phase circuit 12, each multiplexer 24 or 24A of a first set of multiplexers 25 ("input MUXes") of the input phase circuit 12 is configured and arranged to receive a pair of input bits 15, which may be a WEN bit, a tied-low/0 bit ("tielow"), or a data (D) bit as shown. The input MUXes 24 and 24A selectively pass one of the pair of input bits 15 in response to the scan enable (SE) signal, e.g., from the control circuitry 20 shown schematically and well understood in the art. The input MUXes 25 includes a first input MUX 24A arranged to receive a first data bit D[0], e.g., an address bit from the control circuitry 20, and a serial input bit SI[0] likewise from the control circuitry 20. Additional input MUXes 24 are each arranged to receive either a respective pair of data (D) bits or a WEN bit and a single D bit.

As part of the input phase circuit 12, each of a plurality of scan latches 16 is arranged to receive one of the pair of input bits 15 from a respective one of the input MUXes 24, 24A, and to provide an upstream/scan output ($Q_U$) bit in response to an edge of a digital clock (CLK) signal from the control circuitry 20, typically a CLK rising edge. In an embodiment, the scan latches 16 are configured as φ2 latches, which as used herein may entail DQ latches that close when the CLK signal reaches a predetermined logic value, e.g., high/1, and that pass the loaded data downstream when the CLK signal transitions to the opposite logic value, in this instance low/0.

Further with respect to the input phase circuit 12 of FIG. 1, such a circuit 12 may be used as part of the memory circuit 10 having an even integer quantity (n) of upstream scan latches, i.e., the latches 16, with n≥4. The input phase circuit 12 in such an arrangement includes the input MUXes 25 each configured to receive a respective pair of input bits 15. In response to the scan enable signal (SE), and when the DFTRAMBYP signal is high enabling the self-scan process, the input MUXes 25 selectively pass one of the pair of input bits 15 to a respective one of the scan latches 16 of the input phase circuit 12.

The output phase circuit 14 shown schematically in FIG. 1 may include (n/2) downstream sense latches 18 logically coupled to the (n) scan latches 16 by a respective OR logic gate 19 and a respective downstream multiplexer (MUX) 124. In the illustrated embodiment, the sense latches 18 are configured as φ1 latches, which as used herein may entail DQ latches that open when the CLK signal reaches a predetermined logic value, e.g., high/1, and close to pass the loaded data downstream when the CLK signal transitions to the opposite logic value, in this instance low/0.

Each of the OR gates 19 is arranged to receive the sense output bit ($Q_U$) from a different corresponding pair of the scan latches 16, and to perform an OR logical operation thereon to thereby generate an OR output bit 30. Each downstream MUX 124 receives an OR output bit 30 from the respective OR gate 19 and a bit value 32 from the bit array 22, and is arranged to pass either a corresponding bit 32 from the bit array 22 or the OR output bit 30 from a corresponding one of the OR gates 19. The sense latches 18 are arranged to receive the corresponding bit 30 or 32 from one of the second set of multiplexers 124, and to output a sense output bit ($Q_D$) as an output of the memory circuit 10 during a self-scan process. Thus, outputs of the memory circuit 10 include a scan output (SO[0]) and the various Q bits, i.e., Q[0], Q[1], Q [n/2−1], the latter being Q[3] in the non-limiting embodiment of FIG. 1 in which n=6.

As depicted in FIG. 1, the sense output bits ($Q_D$) provided by operation of the downstream sense latches 18 are fed back into two or more input MUXes 24 as either one of the pair of D bits or as the single D bit. The MUX and feedback connections thus enable a scan shift operation from n−1 to n. Operation of the memory circuit 10 of FIG. 1 when a bit-write-mask is enabled/ON is depicted in table 40 of FIG. 2. Table 40 and the various bit-write-OFF/disabled mode tables 140, 240, and 340 of FIGS. 4, 6, and 8, describe a corresponding state of each of set of different states or values: clock signal (CLK), i.e., rising (R) edge in the various tables, a chip enable (CEN), a global write enable (GWEN), input data bit (D), write enable bit (WEN), serial input bit (SI), control signal (DFTRAMBYP), i.e., a binary signal controlling when the memory circuit 10 is free to enter test/memory self-scan mode, scan enable (SE) initiating a given scan shift operation, and output data (Q), with the latter corresponding to the sense output $Q_D$ of FIG. 1. Tables 40, 140, 240, and 340 also include a "Description" column denoting the accompanying mode, i.e., WRITE (Mission Mode), READ (Mission Mode), Scan Capture, and Scan Shift.

As used in the various tables, "X" indicates that the value is not relevant to the mode, while a 1 or 0 correspond to a logical high or low state, respectively. Likewise for each table, "*" corresponds to the value of the sense output bit during a scan shift, with the value of the sense output bit varying as follows:

SO[0]=Q[n/2−1] and SO[1]=Q[n/2]

SI[0]=>Q[0]=>Q[1] . . . =>Q[n/2−1]=>SO[0]

SI[1]=>Q[n−1]=>Q[n−2]=>=>Q[n/2]=>SO[1].

where once again, Q corresponds to the sense output bit $Q_D$ in FIG. 1.

Figure 3:
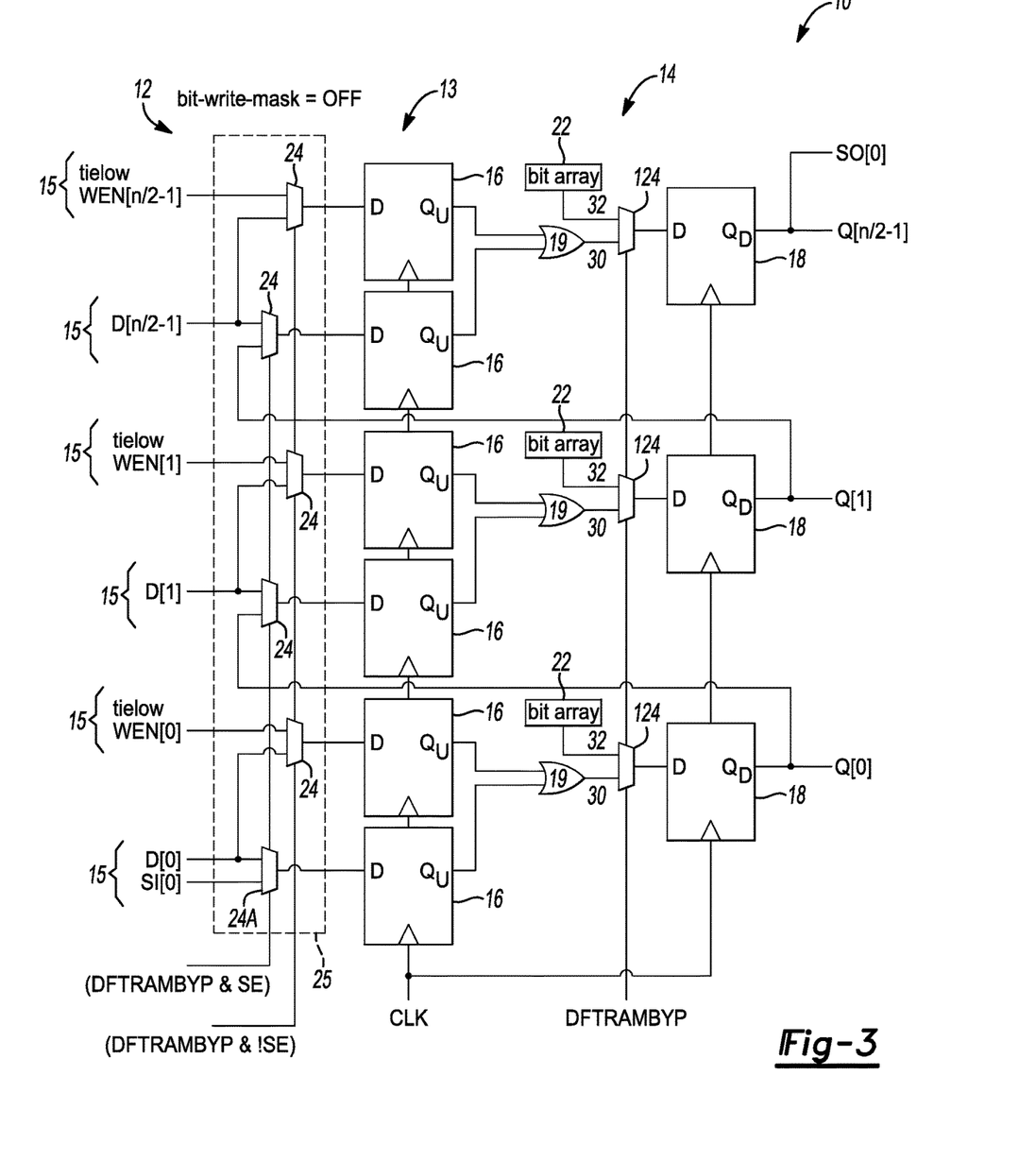
FIGS. 3 and 4 respectively depict a circuit diagram and associated truth table for the exemplary memory circuit of FIG. 1 for a scan mode in which the bit-write-mask function is disabled.
Figure 4:
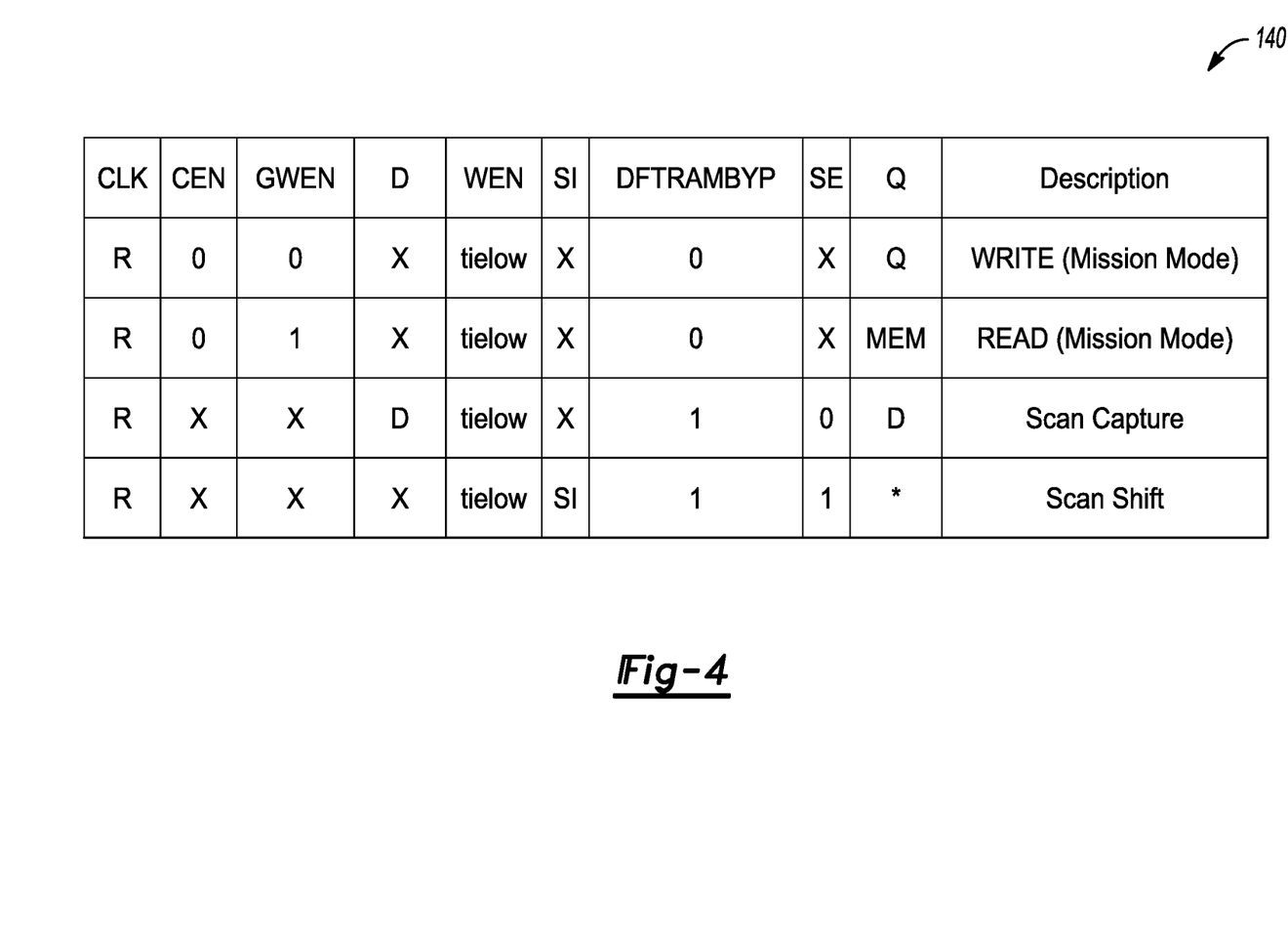

Referring to FIGS. 3 and 4, the configuration of FIG. 1 facilitates latent defect detection in tied-off logic cones whenever a bit-write-mask function is disabled/turned OFF. The disclosed memory circuit 10 enables nodes tied to tied-low WEN bits to be selectively toggled between high/1 and low/0 logic values as needed during such a mode, thus providing a level of control and observability not ordinarily available in the face of tied-off WEN logic cones.

As noted above, the first input MUX 24A of the first set of multiplexers 25 is arranged to receive the first data bit D[0] and a serial input bit SI[0], while the additional multiplexers 24 of the first set of multiplexers 25 are each arranged to receive either (i) a respective pair of D bits, or (ii) a WEN bit and a single D bit, depending on the location of the multiplexer 24 or 24A. In the embodiment of FIG. 3, the D bits are useable to detect defects when the scan chain is enabled. Output bit Q[0] is fed back as a data bit with data bit D[1] into one the multiplexers 24.

Similarly, the output bit Q[1] is fed back as a data bit with data bit D[n/2−1] into another of the input MUXes 24. The WEN bits WEN[0], WEN[1], and WEN[n/2−1], all of which are tied-low, are fed into respective input MUXes 24. However, the corresponding input MUXes 24 also a respective controllable data bit, i.e., D[0], D[1], and D[n/2−1], respectively. Thus, the memory circuit 10 of FIG. 3 enables WEN tie-off paths or logic cones to effectively toggle or transition between high and low logic values and vice versa during a scan capture operation, i.e., via the controllable D bit, whenever the bit-write-mask function is disabled/turned OFF.

One may wish to capture unique transitions between WEN and D on the same bit slice in order to more accurately detect certain types of transition faults. The memory circuit 10 of FIG. 5 and the states depicted in corresponding table 240 of FIG. 6 optimize such an approach using a new output bit Q[y−1] from current data D[y] to provide separate and distinct control of previously untested logic cones. In this configuration, at least two input MUXes 24 of the first set of multiplexers 25 share one of the pair of D bits or the single D bit. For instance, the input bits 15 may be D[1] and Q[0] in one input MUX 24 and WEN[1] (tied-low) and Q[0] in another input MUX 24. Likewise, input bits 15 for another pair of the input MUXes could be Q[1] and D[n/2−1] for one input MUX 24 and Q[1] and WEN[n/2−1] for another input MUX 24.

Figure 5:
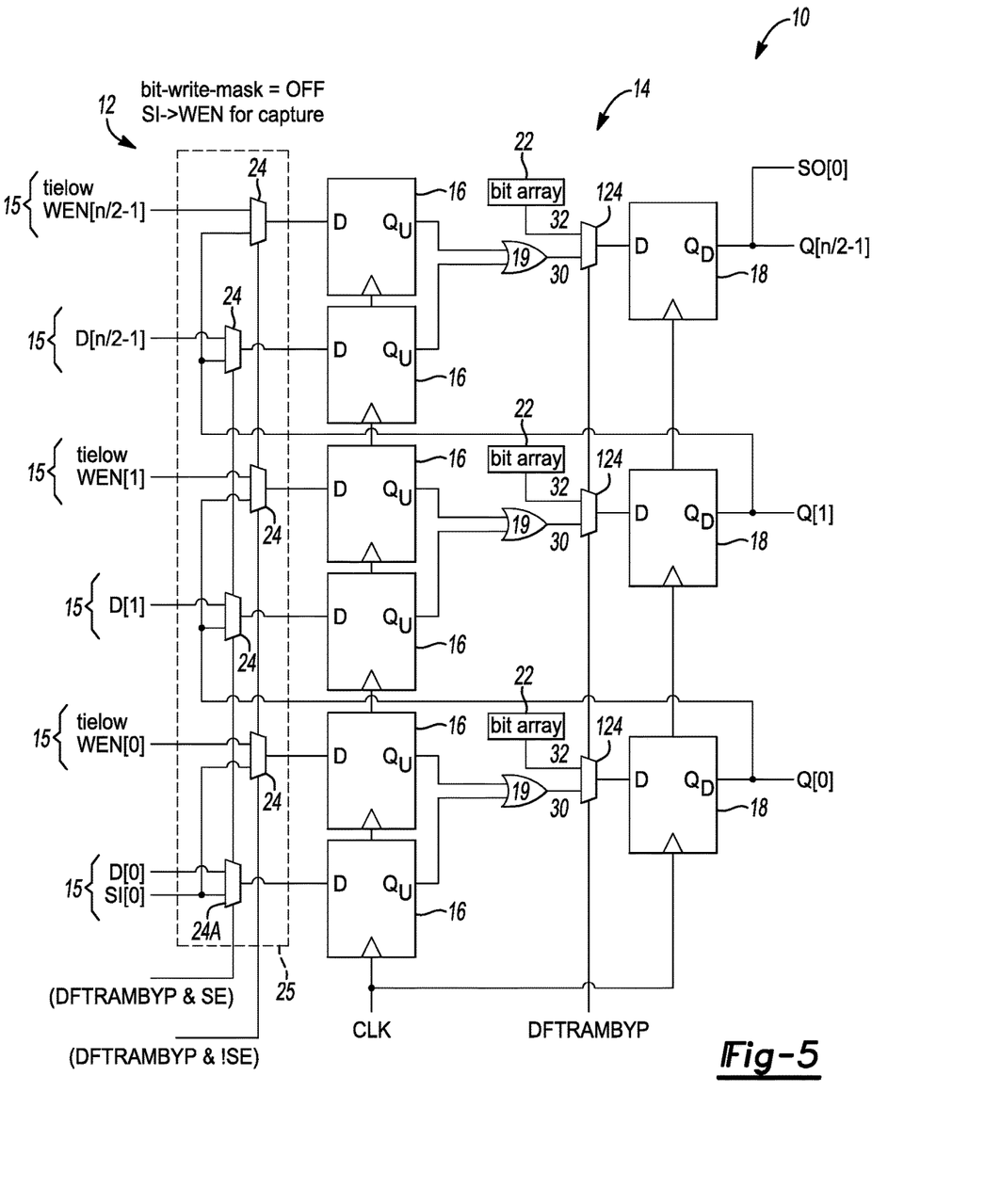
FIGS. 5 and 6 respectively depict a circuit diagram and associated truth table for an alternative embodiment of the memory circuit of FIGS. 1 and 3 for a scan mode in which the bit-write-mask function is disabled.
Figure 6:
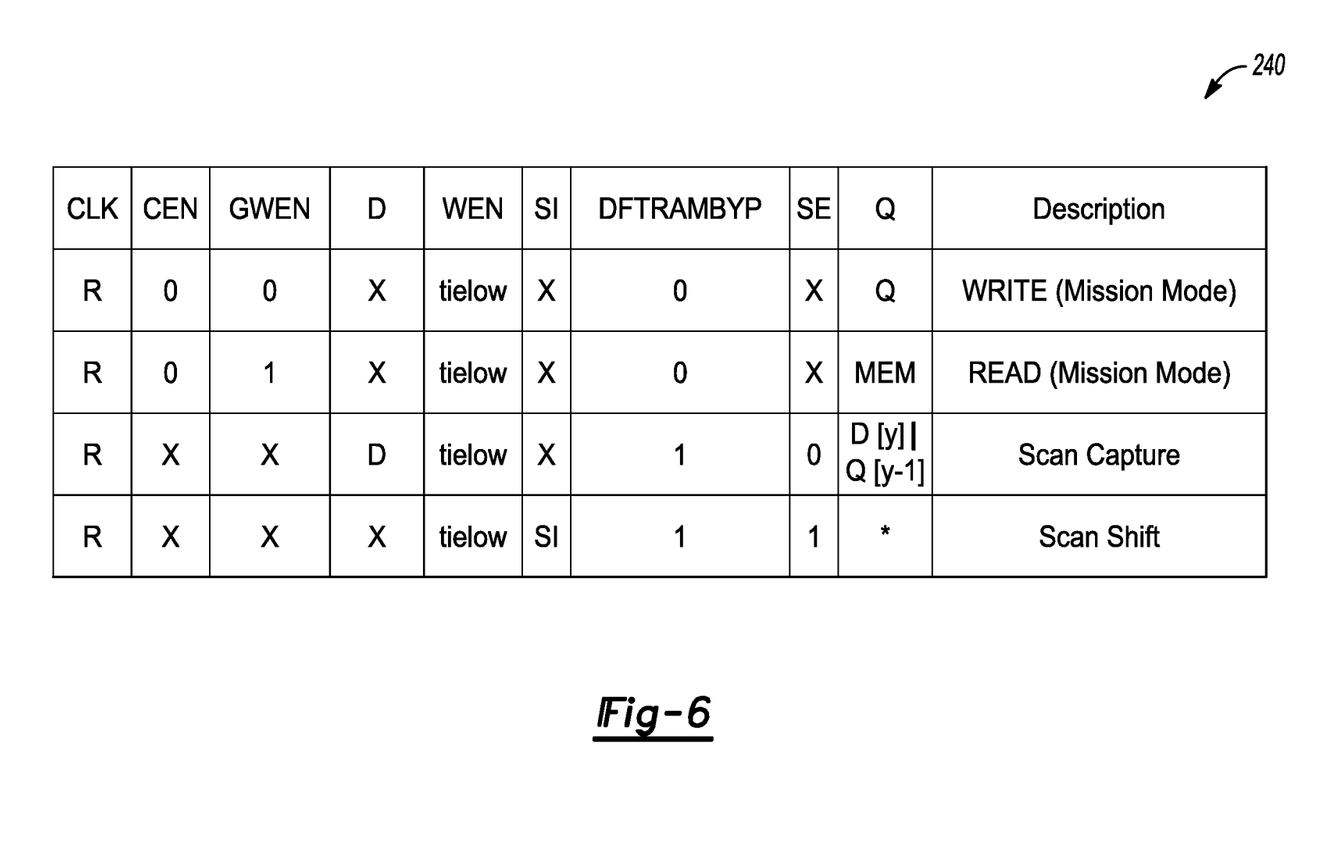

The embodiment of FIG. 5 leaves as unobservable only those possible latent faults that might be present at the tied-low WEN(n/2−1). Output bits $Q_D$ output by two or more of the sense latches 18, here Q[0] and Q[1], are used as the single D bits of at least two different multiplexers 24 in this example, i.e., in conjunction with the WEN bits. In other words, unlike FIG. 3 where the WEN bits were paired with D bits at input MUXes 24, the output bits Q[0] and Q[1] are now used as the accompanying data bit to the WEN bits WEN[1] and WEN (n/2−1), as well as serving as an additional data bit for the remaining multiplexers 24 (not including first multiplexer 24A).

Figure 7:
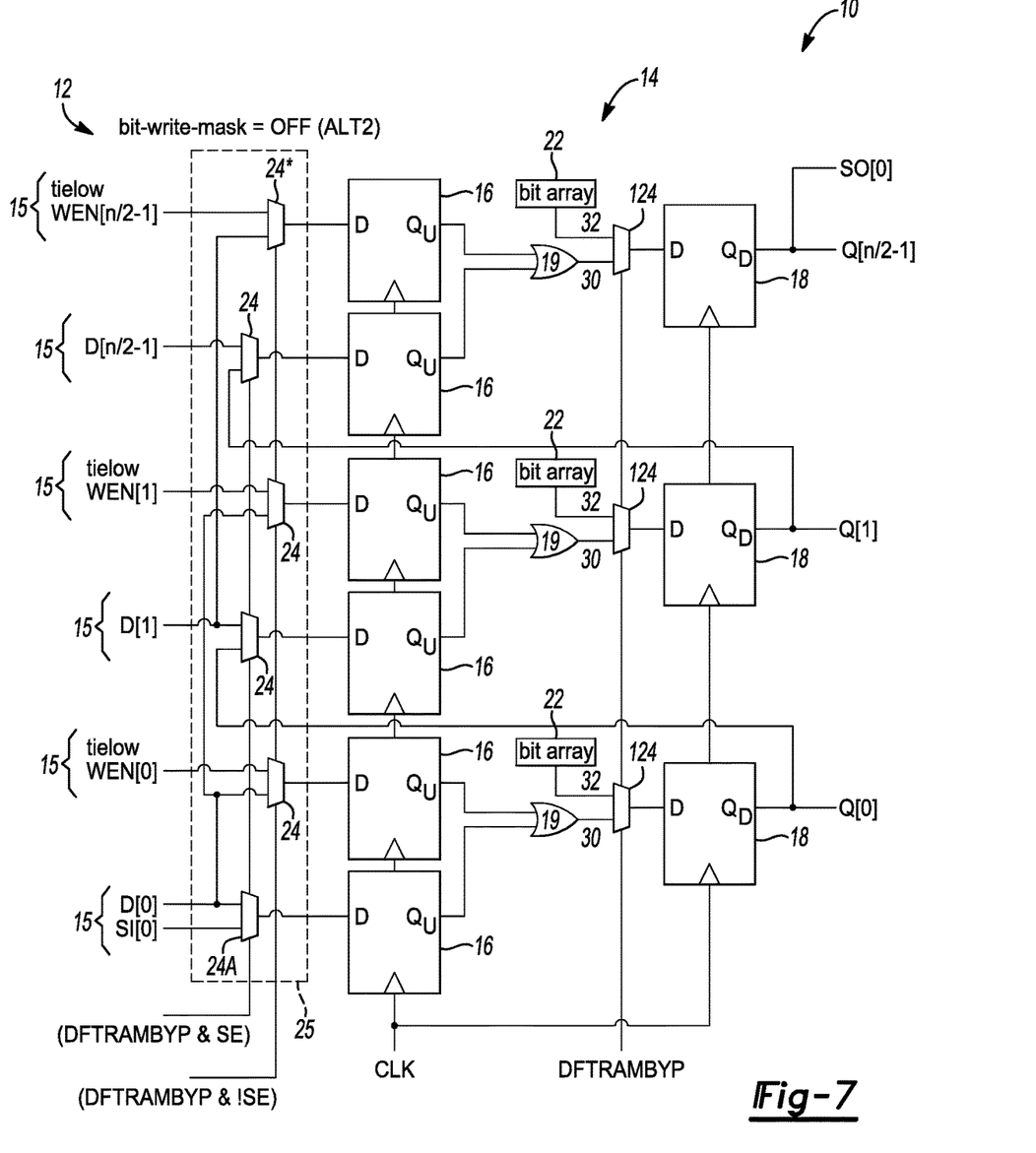
FIGS. 7 and 8 respectively depict a circuit diagram and associated truth table for another alternative embodiment of the memory circuit of FIGS. 1 and 3 for a scan mode in which the bit-write-mask function is disabled.
Figure 8:
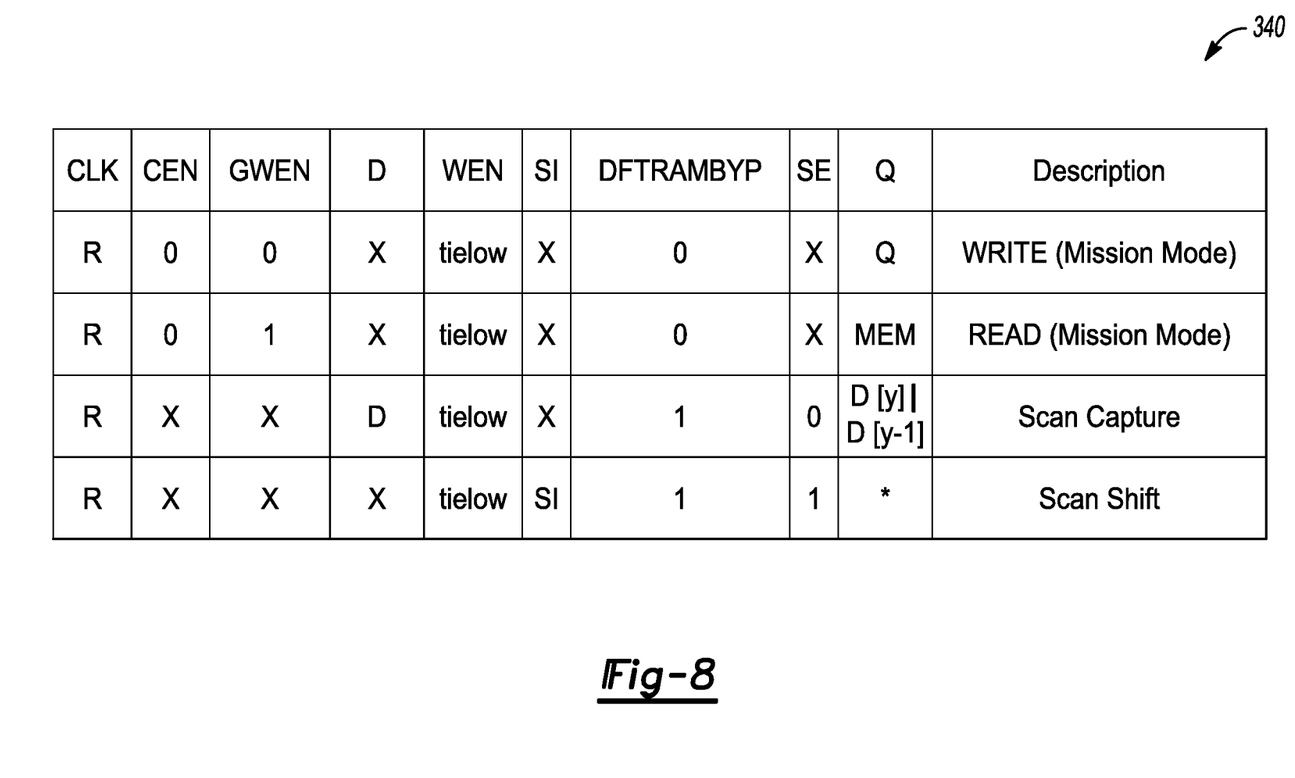

Referring to FIGS. 7 and 8, separate and distinct control functions may be provided at multiplexer 24*, located at the top of FIG. 7, albeit at the cost of additional routing. That is, a given sense output bit is not shared between two different input MUXes 24, unlike in the embodiment of FIG. 5. Q[0] in this configuration is used solely with data bit D[1] at an input MUX 24, while Q[1] is used solely with D[n/2−1], and so forth.

As will be appreciated by those of ordinary skill in the art, the above teachings enable full control and observability of tied-off logic cones during a memory scan. In view of the disclosure, use of the memory circuit 10 improves transition coverage, and allows an ordinarily low WEN tie-off path to toggle during scan capture when the bit mask function is disabled by capturing D inputs. By re-using latches and other circuits ordinarily used in functional mode in the above-described manner, the present teachings enable the highest quality of testing possible relative to conventional approaches, resulting in a more efficient and less expensive approach. These and other potential benefits will be readily appreciated by one of ordinary skill in the art in view of the disclosure.

While aspects of the present disclosure have been described in detail with reference to the illustrated embodiments, those skilled in the art will recognize that many modifications may be made thereto without departing from the scope of the present disclosure. The present disclosure is not limited to the precise construction and compositions disclosed herein; any and all modifications, changes, and variations apparent from the foregoing descriptions are within the spirit and scope of the disclosure as defined in the appended claims. Moreover, the present concepts expressly include any and all combinations and subcombinations of the preceding elements and features.

What is claimed is:

1. A memory circuit comprising:
an input phase circuit having a set of input multiplexers each configured to receive a respective pair of input bits, and in response to a scan enable signal (SE), to selectively pass one of the respective pair of input bits, wherein the set of input multiplexers includes a first input multiplexer arranged to receive a first data bit D[0] and a serial input bit SI[0] as the respective pair of input bits, and additional input multiplexers each arranged to receive either a respective pair of data (D) bits, or a write-enable (WEN) bit and a single D bit, as the respective pair of input bits, and a plurality of scan latches each arranged to receive one of the respective pair of input bits from a respective one of the input multiplexers, and to provide an scan output bit ($Q_U$) in response to a digital clock signal; and
an output phase circuit having:
a plurality of logical OR gates each arranged to receive the scan output bit from a different corresponding pair of the scan latches, and to perform a logical OR operation thereon to thereby generate an OR output bit;
a set of output multiplexers each of arranged to pass either a corresponding bit from a bit array or the OR output bit from a corresponding one of the OR gates; and
a plurality of sense latches each arranged to receive the corresponding bit from one of the output multiplexers and provide a sense output bit ($Q_D$, i.e., Q[0], Q[1], . . . Q[n/2−1]);
wherein n is an even integer value greater than 1;
wherein each sense output bit ($Q_D$) from the sense latches is fed into at least one of the input multiplexers as either one of the pair of D bits or as the single D bit to thereby enable the WEN bit to toggle between high and low logical values when a bit-write-mask function is disabled in the memory circuit.

2. The memory circuit of claim 1, wherein the sense output bits ($Q_D$) being output by the sense latches are used as the single D bits of at least two different multiplexers of the set of input multiplexers.

3. The memory circuit of claim 2, wherein the sense output bits ($Q_D$) being output by the sense latches and used as the single D bits of at least two different multiplexers of the first set of multiplexers are respectively routed solely to one of the two different multiplexers.

4. The memory circuit of claim 1, wherein the scan latches are configured to store a given bit value while a clock pulse of the digital clock signal remains low.

5. The memory circuit of claim 1, wherein at least two multiplexers of the set of input multiplexers share one of the pair of D bits or the single D bit.

6. The memory circuit of claim 1, further comprising control circuitry configured to provide the serial input bit SI[0], the digital clock signal (CLK), and the bit array.

7. The memory circuit of claim 1, wherein the input phase circuit is characterized by an absence of AND logic gates.

8. The memory circuit of claim 1, wherein the memory circuit is an embedded static random access memory (SRAM) scan circuit.

9. An input phase circuit for use in a memory circuit having (n) scan latches logically coupled to (n/2) sense latches by a respective logical OR gate and a respective output multiplexer, each output multiplexer receiving an OR output bit from the respective OR gate and a bit value from a bit array, the input phase circuit comprising:

a set of (n) input multiplexers each configured to receive a respective pair of input bits and, in response to a scan enable signal (SE), to selectively pass one of the respective pair of input bits to a respective one of the scan latches, the set of (n) input multiplexers including:
a first multiplexer arranged to receive a first data bit D[0] and a serial input bit SI[0] from control circuitry; and
(n−1) additional multiplexers each arranged to receive either a respective pair of data (D) bits, or a write-enable (WEN) bit and a single D bit;
wherein n is an even integer value greater than 1;
wherein a sense output bit ($Q_D$) from a plurality of the (n/2) sense latches is fed into at least one of the (n−1) additional multiplexers as either one of the pair of D bits or as the single D bit, to thereby enable the WEN bit to selectively toggle between high and low logical values when a bit-write-mask function of the memory circuit is disabled.

10. The input phase circuit of claim 9, wherein the single D bit of at least two different multiplexers of the set of input multiplexers are sense output bits ($Q_D$) that are output by two or more of the sense latches.

11. The input phase circuit of claim 9, wherein the single D bits of different multiplexers of the set of input multiplexers are routed solely to one of the different multiplexers as sense output bits ($Q_D$) by the sense latches.

12. The input phase circuit of claim 9, wherein at least two multiplexers of the set of input multiplexers share one of the pair of D bits or the single D bit.

13. The input phase circuit of claim 9, further comprising control circuitry configured to provide the serial input bit SI[0] and the bit array.

14. The input phase circuit of claim 9, wherein the input phase circuit is characterized by an absence of AND logic gates.

15. The input phase circuit of claim 9, wherein the memory circuit is a static random access memory (SRAM) circuit.

16. A method for performing an embedded scan operation in a memory circuit, the method comprising:
multiplexing a respective pair of input bits through each multiplexer of a set of input multiplexers in response to a scan enable (SE) signal, wherein the set of input multiplexers includes a first multiplexer arranged to receive a first data bit (D[0]) and a serial input bit (SI[0]), and a plurality of additional input multiplexers each arranged to receive either a respective pair of data bits or a write-enable bit (WEN) and a single data bit;
generating a plurality of scan output bits ($Q_U$), including latching the multiplexed bits in response to a clock signal (CLK) via a plurality of scan latches;
processing different corresponding pairs of the scan output bits ($Q_U$) through a respective OR gate to thereby generate a plurality of OR logic bits;
latching the OR logic bits via a plurality of sense latches to thereby generate a plurality of sense output bits ($Q_D$); and
feeding at least some of the sense output bits ($Q_D$) into at least one of the additional input multiplexers as one of the pair of data bits or the single data bit to thereby enable the WEN bit to selectively toggle between high and low logical values when a bit-write-mask function of the memory circuit is disabled.

17. The method of claim 16, including feeding the scan output bits ($Q_D$) into two or more of the additional input multiplexers.

18. The method of claim 16, including feeding each scan output bit ($Q_D$) solely to a respective one of the additional input multiplexers.

* * * * *